United States Patent
Ryu et al.

(10) Patent No.: US 8,731,126 B2
(45) Date of Patent: May 20, 2014

(54) PHASE LOCKED LOOP AND SATELLITE COMMUNICATION TERMINAL USING THE SAME

(75) Inventors: Joon-Gyu Ryu, Daejeon (KR); Dae-Ig Chang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 844 days.

(21) Appl. No.: 12/942,350

(22) Filed: Nov. 9, 2010

(65) Prior Publication Data

US 2011/0116587 A1 May 19, 2011

(30) Foreign Application Priority Data

Nov. 16, 2009 (KR) .................. 10-2009-0110192

(51) Int. Cl.
*H03D 3/24* (2006.01)
*H03L 7/06* (2006.01)

(52) U.S. Cl.
USPC .......................................... 375/376; 327/156

(58) Field of Classification Search
USPC .......................................... 375/376; 327/156
See application file for complete search history.

(56) References Cited

U.S. PATENT DOCUMENTS

| | | | |
|---|---|---|---|
| 4,061,973 A | 12/1977 | Reimers et al. | |
| 5,146,186 A | 9/1992 | Vella | |
| 5,712,602 A | 1/1998 | Suematsu | |
| 6,868,261 B2 | 3/2005 | Shi et al. | |
| 2002/0021762 A1* | 2/2002 | Takagi | 375/261 |
| 2008/0284525 A1* | 11/2008 | Williams | 331/11 |
| 2012/0057508 A1* | 3/2012 | Moshfeghi | 370/277 |

FOREIGN PATENT DOCUMENTS

| | | |
|---|---|---|
| DE | 3825664 A1 | 2/1990 |
| JP | 2002-033675 A | 1/2002 |
| KR | 1997-0055570 | 7/1997 |
| KR | 10-0272170 B1 | 8/2000 |

OTHER PUBLICATIONS

Kwang-Seon Kim et al., "A Design and Fabrication of Low Phase Noise Frequency Synthesizer Using Dual Loop PLL", Korea Information and Communications Society, vol. 27 pp. 191-200, Feb. 2002.

* cited by examiner

*Primary Examiner* — Shuwang Liu
*Assistant Examiner* — Nader Bolourchi
(74) *Attorney, Agent, or Firm* — Rabin & Berdo, P.C.

(57) ABSTRACT

A phase locked loop includes: a loop filter; a voltage controlled oscillating unit configured to output a frequency varying according to an output voltage of the loop filter; a frequency down-converting unit configured to down-convert an output frequency of the voltage controlled oscillating unit according to a band of the output frequency of the voltage controlled oscillating unit; and a frequency divider configured to divide a frequency down-converted by the frequency down-converting unit. The output frequency of the voltage controlled oscillating unit varies according to the output voltage of the loop filter and a control signal compensating the frequency down-converted by the frequency down-converting unit.

12 Claims, 7 Drawing Sheets

PHASE LOCKED LOOP AND SATELLITE COMMUNICATION TERMINAL USING THE SAME

CROSS-REFERENCE(S) TO RELATED APPLICATIONS

The present application claims priority of Korean Patent Application No. 10-2009-0110192, filed on Nov. 16, 2009, which is incorporated herein by reference in its entirety.

BACKGROUND OF THE INVENTION

1. Field of the Invention

Exemplary embodiments of the present invention relate to a phase locked loop (PLL); and, more particularly, to a PLL and a satellite communication terminal using the same.

2. Description of Related Art

A PLL refers to a circuit which obtains a stable oscillation output having a frequency equal to that of a reference signal or a divided or multiplied frequency of the reference signal. The PLL serves as a local oscillator which allocates a channel or converts a frequency into a radio frequency (RF) or an intermediate frequency (IF) in a wireless communication system.

FIG. 1 is a block diagram illustrating a structure of a PLL.

Referring to FIG. 1, the PLL 100 includes a phase detector 101, a charge pump 103, a loop filter 105, a voltage controlled oscillator (VCO) 107, and a frequency divider 109.

The phase detector 101 detects a phase difference between a reference frequency fr and a division frequency fo/N outputted from the frequency divider 109, and outputs a signal corresponding to the detected phase difference. Generally, a reference frequency fr is generated using a temperature compensated X-tal oscillator (hereinafter, referred to as a TCXO) which is stable with respect to temperature change.

The charge pump 103 converts an output signal of the phase detector 101 into a voltage level.

The loop filter 105 accumulates charges from the charge pump 103 and discharges the accumulated charges, and filters noise containing unnecessary high frequency components. Generally, the loop filter 105 has a low pass filter (LPF) structure.

The VCO 107 outputs a frequency fo which is proportional to an inputted voltage.

The frequency divider 109 divides the frequency fo from the VCO 107 by a frequency division ratio N, and outputs the division frequency fo/N which is phase-compared with the reference frequency fr by the phase detector 101.

Phase noise refers to unnecessary energy which is not a signal component and appears around a desired frequency such as an oscillation frequency or a carrier frequency. Since such phase noise characteristic of the PLL affects the performance of the overall system, phase noise must be reduced.

SUMMARY OF THE INVENTION

An embodiment of the present invention is directed to a PLL having a low phase noise characteristic and a satellite communication terminal using the same.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a phase locked loop includes: a loop filter; a voltage controlled oscillating unit configured to output a frequency varying according to an output voltage of the loop filter; a frequency down-converting unit configured to down-convert an output frequency of the voltage controlled oscillating unit according to a band of the output frequency of the voltage controlled oscillating unit; and a frequency divider configured to divide a frequency down-converted by the frequency down-converting unit, wherein the output frequency of the voltage controlled oscillating unit varies according to the output voltage of the loop filter and a control signal compensating the frequency down-converted by the frequency down-converting unit.

In accordance with another embodiment of the present invention, a satellite communication terminal for transmitting a predetermined frequency includes: a phase locked loop; and a mixer configured to convert the predetermined frequency, which is to be transmitted, by using an output frequency of the phase locked loop, wherein the phase locked loop includes: a loop filter; a voltage controlled oscillating unit configured to output a frequency varying according to an output voltage of the loop filter; a frequency down-converting unit configured to down-convert an output frequency of the voltage controlled oscillating unit according to a band of the output frequency of the voltage controlled oscillating unit; and a frequency divider configured to divide a frequency down-converted by the frequency down-converting unit, wherein the output frequency of the voltage controlled oscillating unit varies according to the output voltage of the loop filter and a control signal compensating the frequency down-converted by the frequency down-converting unit.

In accordance with another embodiment of the present invention, a satellite communication terminal for receiving a predetermined frequency includes: a phase locked loop; and a mixer configured to convert the received frequency by using an output frequency of the phase locked loop, wherein the phase locked loop includes: a loop filter; a voltage controlled oscillating unit configured to output a frequency varying according to an output voltage of the loop filter; a frequency down-converting unit configured to down-convert an output frequency of the voltage controlled oscillating unit according to a band of the output frequency of the voltage controlled oscillating unit; and a frequency divider configured to divide a frequency down-converted by the frequency down-converting unit, wherein the output frequency of the voltage controlled oscillating unit varies according to the output voltage of the loop filter and a control signal compensating the frequency down-converted by the frequency down-converting unit.

DESCRIPTION OF SPECIFIC EMBODIMENTS

Figure 1:
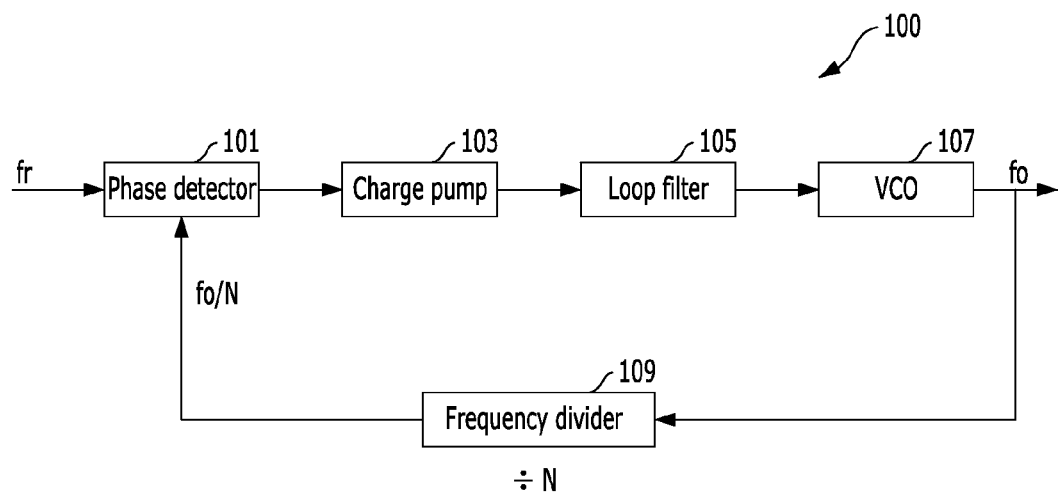
FIG. 1 is a block diagram illustrating a structure of a PLL.

The following descriptions will exemplify the principle of the present invention. Therefore, although not described and illustrated clearly in this specification, the principle of the present invention may be embodied and various apparatuses included in the concept and scope of the present invention may be invented by those skilled in the art. Conditional terms and embodiments enumerated in this specification are clearly intended only to make the concept of the present invention understood. Furthermore, it should be understood that the present invention is not limited to the enumerated embodiments and states.

Furthermore, it should be understood that all detailed descriptions in which specific embodiments as well as the principle, viewpoint, and embodiments of the present invention are enumerated are intended to include structural and functional equivalents. Furthermore, it should be understood that such equivalents include all elements which are developed to perform the same function as equivalents to be invented in the future as well as currently-known equivalents, that is, regardless of the structure.

Therefore, it should be understood that block diagrams of this specification illustrate the conceptual viewpoint of exemplary circuits for embodying the principle of the present invention. Similarly, it should be understood that flowcharts, state transition diagrams, pseudo codes and so on can be embodied as computer readable codes on a computer readable recording mediums, and illustrate various processes which are performed by a computer or processor regardless of whether the computer or processor is clearly illustrated or not.

The functions of various elements illustrated in diagrams including processors or functional blocks indicated by a similar concept to the processors may be provided by the use of hardware having an ability of executing suitable software as well as dedicated hardware. When provided by processors, the functions may be provided by a single dedicated processor, a single common processor, or a plurality of individual processors. Some of the plurality of individual processors may be shared.

The use of processors, control, or terms presented as a similar concept to the processors or the control should not be analyzed by exclusively citing hardware having an ability of executing software. It should be understood that digital signal processor (DSP) hardware, ROM, RAM, and non-volatile memory for storing software are suggestively included without a limitation. Other well-known hardware may also be included.

In the claims of this specification, it is intended that a component expressed as means for performing a function described in the detailed descriptions include combinations of circuit elements performing the function or methods of performing a function including all forms of software containing firmware and micro codes. The component is coupled to a proper circuit for executing the software to perform the function. In the present invention defined by such claims, functions provided by means enumerated in various manners are combined, and the component is combined with methods required by the claims. Therefore, it should be understood that any means capable of providing the function is equivalent to that grasped from this specification.

The above-described purpose, feature, and advantage will be clarified by the following detailed descriptions which are related to the accompanying drawings. Accordingly, the technical spirit of the present invention can be easily embodied by those skilled in the art to which the present invention pertains. Furthermore, when it is determined that a specific description for a well-known technology related to the present invention may unnecessarily make the purport of the present invention ambiguous in the detailed descriptions of the present invention, the specific description will be omitted. Hereafter, exemplary embodiments of the present invention will be described in detail with reference to the accompanying drawings.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In accordance with exemplary embodiments of the present invention, a low phase noise characteristic is obtained by reducing a frequency division ratio because an output frequency of a PLL generating a local oscillation signal is down-converted using different frequencies according to bands of the output frequency of the PLL.

Figure 2:
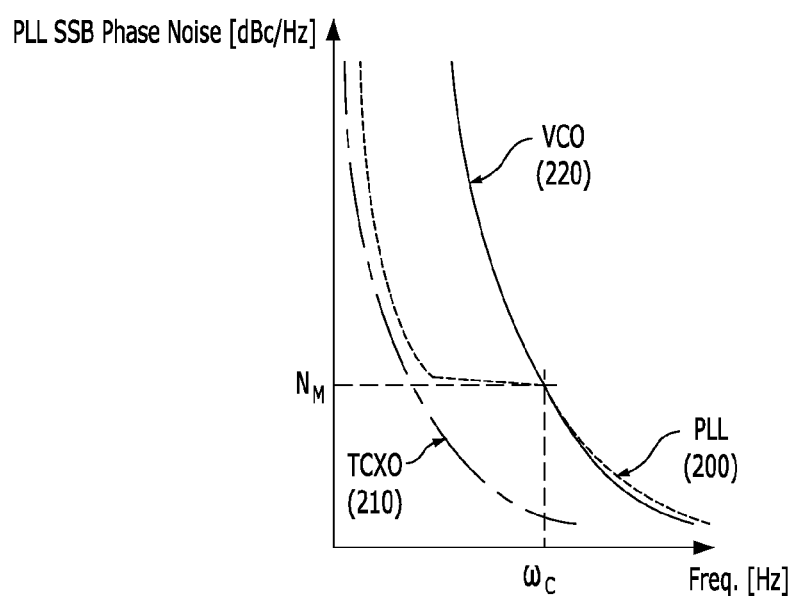
FIG. 2 is a graph showing a phase noise characteristic of the PLL.

FIG. 1 is a block diagram illustrating a structure of a PLL, and FIG. 2 is a graph showing a phase noise characteristic of the PLL.

Referring to FIGS. 1 and 2, phase noise 200 of the PLL 100 follows phase noise 210 of a reference oscillator such as a TCXO within a band Wc of a loop filter 105 and then increases by a frequency division ratio N. The phase noise 200 of the PLL 100 follows phase noise 220 of a VCO 107 outside the band Wc of the loop filter 105.

Noise $N_M$ multiplied in the PLL 100 is expressed as Equation 1 below.

$$N_M = 1 \text{ Hz Noise floor} + 10 \log(F\text{comp}) + 20 \log(N) \qquad \text{Eq. 1}$$

In Equation 1 above, 1 Hz noise floor is an inherent noise of a PLL (100) integrated circuit (IC) and refers to noise when the frequency division ratio N is 1 and the frequency Fcomp of the phase detector 101 is 1 Hz. The frequency Fcomp of the phase detector 101 refers to a frequency which is compared with the division frequency fo/N in the phase detector 101. The frequency Fcomp of the phase detector 1-1 may be the reference frequency fr, or may be a frequency fr/K when the reference frequency fr is divided by a different division ratio K and compared with the division frequency fo/N.

As can be seen from Equation 1 above, the noise $N_M$ multiplied in the PLL 100 increases as the frequency division ratio N and the frequency Fcomp of the phase detector 101 increases. At this time, since the frequency Fcomp of the phase detector 101 is a fixed value, a good phase noise characteristic of the PLL 100 can be obtained when the frequency division ratio N is low within the band Wc of the loop filter 105 and the VCO 107 having an excellent phase noise characteristic is used outside the band We of the loop filter 105.

Figure 3:
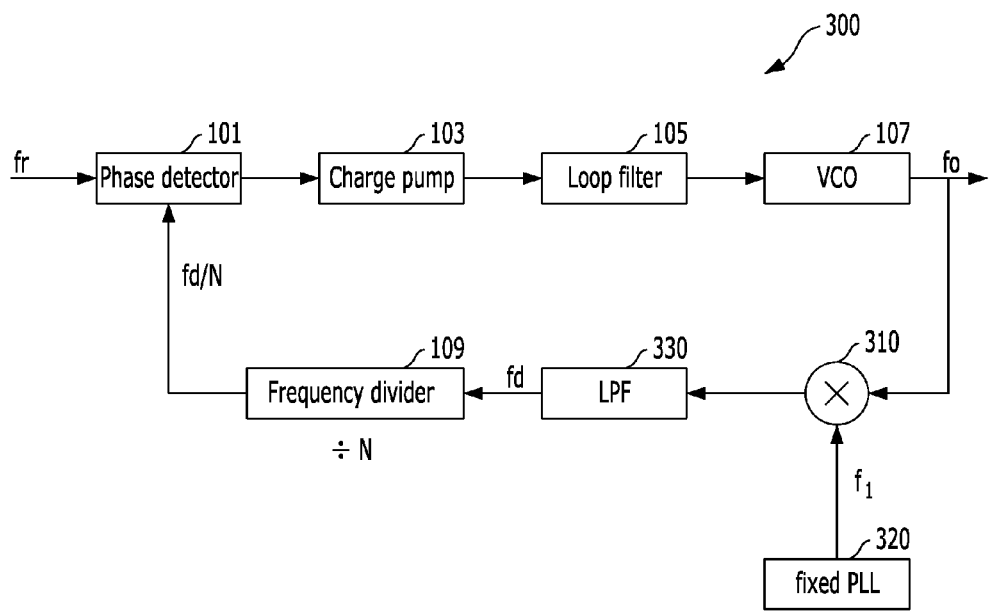
FIG. 3 is a block diagram illustrating a structure of an offset PLL.

FIG. 3 is a block diagram illustrating a structure of an offset PLL.

Referring to FIG. 3, the offset PLL 300 includes a phase detector 101, a charge pump 103, a loop filter 105, a VCO 107, a mixer 310, a fixed PLL 320, an LPF 330, and a frequency divider 109. Since components common to those of FIG. 1 have been described above, detailed description thereof will be omitted.

The fixed PLL 320 is a PLL which outputs a fixed frequency f1.

The mixer 310 down-converts the output frequency fo of the VCO 107 using the frequency f1 outputted from the fixed PLL 320.

The LPF 330 low-pass-filters an output frequency of the mixer 310 and outputs a down-converted frequency fd.

In the case of the PLL 100, the output frequency fo of the VCO 107 is divided by the frequency divider 109. However, in the case of the offset PLL 300, the down-converted frequency fd is divided. Therefore, the frequency division ratio N is lowered to thereby reduce phase noise.

However, when the offset PLL 300 must generate a broadband local oscillation signal like a satellite communication, the frequency division ratio N may be lowered when the frequency is low, but the frequency division ratio N is increased when the frequency is high. Therefore, the offset PLL 300 causes a difference in the performance of phase noise at a low frequency band and a high frequency band.

For example, the phase noise $N_M$ when the output frequency fo of the PLL 300 is 1-2 GHz is calculated as follows. It is assumed that the frequency Fcomp of the phase detector 101 is 200 KHz, 1 Hz noise floor is −200 dBc/Hz, and the output frequency f1 of the fixed PLL 320 is 900 MHz. The down-converted frequency fd and the frequency division ratio N are calculated using Equations 2 and 3 below, and the phase noise $N_M$ is calculated using Equation 1 above.

$$fd = fo - f1 \qquad \text{Eq. 2}$$

$$N = fd/F\text{comp} \qquad \text{Eq. 3}$$

In the case in which the output frequency fo of the offset PLL 300 is 1 GHz, the frequency division ratio N and the phase noise $N_M$ are as follows.

$$N = fd(1\text{ GHz} - 900\text{ MHz} = 100\text{ MHz})/F\text{comp}(200\text{ KHz}) = 500$$

$$N_M = -200 + 10\log(200000) + 20\log(500) = -93.1\text{ dBc/Hz}$$

In the case in which the output frequency fo of the offset PLL 300 is 1.5 GHz, the frequency division ratio N and the phase noise $N_M$ are as follows.

$$N = fd(1.5\text{ GHz} - 900\text{ MHz} = 600\text{ MHz})/F\text{comp}(200\text{ KHz}) = 3000$$

$$N_M = -200 + 10\log(200000) + 20\log(3000) = -77\text{ dBc/Hz}$$

In the case in which the output frequency fo of the offset PLL 300 is 2 GHz, the frequency division ratio N and the phase noise $N_M$ are as follows.

$$N = fd(2\text{ GHz} - 900\text{ MHz} = 1100\text{ MHz})/F\text{comp}(200\text{ KHz}) = 5500$$

$$N_M = -200 + 10\log(200000) + 20\log(5500) = -72.2\text{ dBc/Hz}$$

As can be seen from the above equations, when the output frequency fo of the offset PLL 300 is 1 GHz and 2 GHz, the difference of the frequency division ratio N increases and the difference of the phase noise is up to 20 dB.

Therefore, when the offset PLL 300 must generate the broadband local oscillation signal, the phase noise increase because the frequency division ratio N increase at a high frequency band, unlike at a low frequency band.

Figure 4:
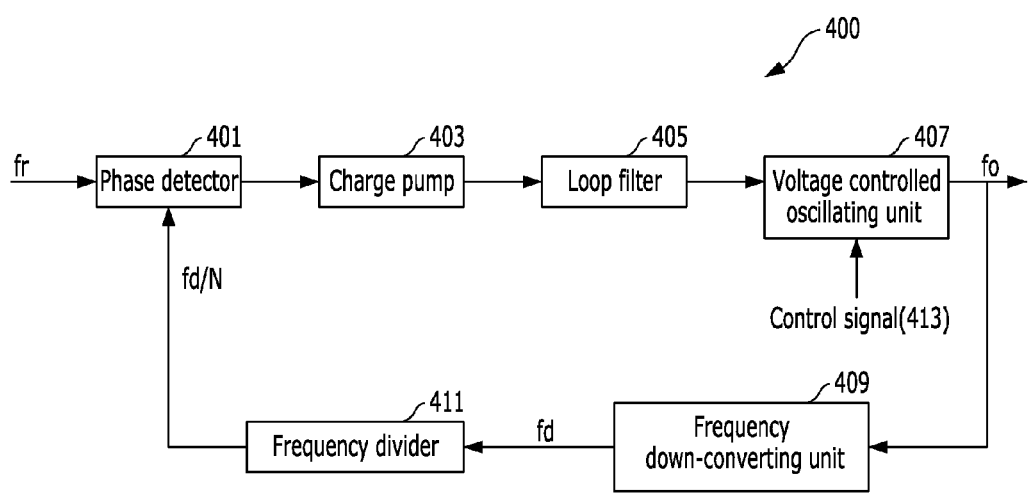
FIG. 4 is a block diagram illustrating a structure of a PLL in accordance with an embodiment of the present invention.

FIG. 4 is a block diagram illustrating a structure of a PLL in accordance with an embodiment of the present invention. Referring to FIG. 4, the PLL 400 in accordance with the embodiment of the present invention includes a loop filter 405, a VCO unit 407, a frequency down-converting unit 409, and a frequency divider 411.

The loop filter 405 outputs a predetermined voltage. As one embodiment, the loop filter 405 may accumulate inputted charges and discharge the accumulated charges, and may filter noise containing unnecessary high frequency components. Generally, the loop filter 405 has a LPF structure.

The VCO unit 407 outputs a frequency fo which varies according to the output voltage of the loop filter 405.

The frequency down-converting unit 409 down-converts the output frequency fo of the VCO unit 407 by using different frequencies according to the band of the output frequency fo of the VCO unit 407.

The frequency divider 411 outputs a division frequency fd/N by dividing the down-converted frequency fd from the frequency down-converting unit 409 by a frequency division ratio N.

Also, the PLL 400 may further include a phase detector 401 and a charge pump 403 like the typical PLL.

The phase detector 401 detects a phase difference between a reference frequency fr and a division frequency fd/N outputted from the frequency divider 411, and outputs a signal corresponding to the detected phase difference. Generally, a reference frequency fr is generated using a TCXO which is stable with respect to temperature change.

The charge pump 403 converts an output signal of the phase detector 401 into a voltage level.

The down-conversion of the output frequency fo in the frequency down-converting unit 409 will be described below in more detail.

First, the band of the output frequency fo of the PLL 400 is divided by n (n>=2). The frequency down-converting unit 409 down-converts the output frequency fo by using different frequencies according to the band to which the output frequency fo belongs. To reduce the frequency division unit N, the down-converted frequency fd must be low. Therefore, as the band of the output frequency fo is higher, the output frequency fo is down-converted using higher frequency. For example, when the output frequency fo of the PLL 400 is 1-2 GHz, the band of the output frequency fo is divided into a first band (equal to or greater than 1 GHz and less than 1.5 GHz) and a second band (equal to or greater than 1.5 GHz and less than 2 GHz). When the output frequency fo exists in the first band, it may be down-converted as much as 900 MHz. When the output frequency fo exists in the second band, it may be down-converted as much as 1400 MHz.

When the output frequency fo is 1 GHz, the output frequency fo exists in the first band and thus the down-converted frequency fd obtained by 900 MHz down-conversion is 100 MHz. When the output frequency fo is 1.5 GHz, the output frequency fo exists in the second band and thus the down-converted frequency fd obtained by 1400 MHz down-conversion is 100 MHz. Although the output frequencies fo are different as 1 GHz and 1.5 GHz, the down-converted frequencies fd from the frequency down-converting unit 409 are equal as 100 MHz. Therefore, the VCO unit 407 outputting the frequencies which varies according to the output voltage of the loop filter 405 cannot distinguish them. Since the output frequency fo is down-converted using a higher frequency at the first band than at the second band, the VCO unit 407 receives a control signal 413, which compensates the difference, together with the output voltage of the loop filter 405, and outputs a desired frequency.

Figure 5:
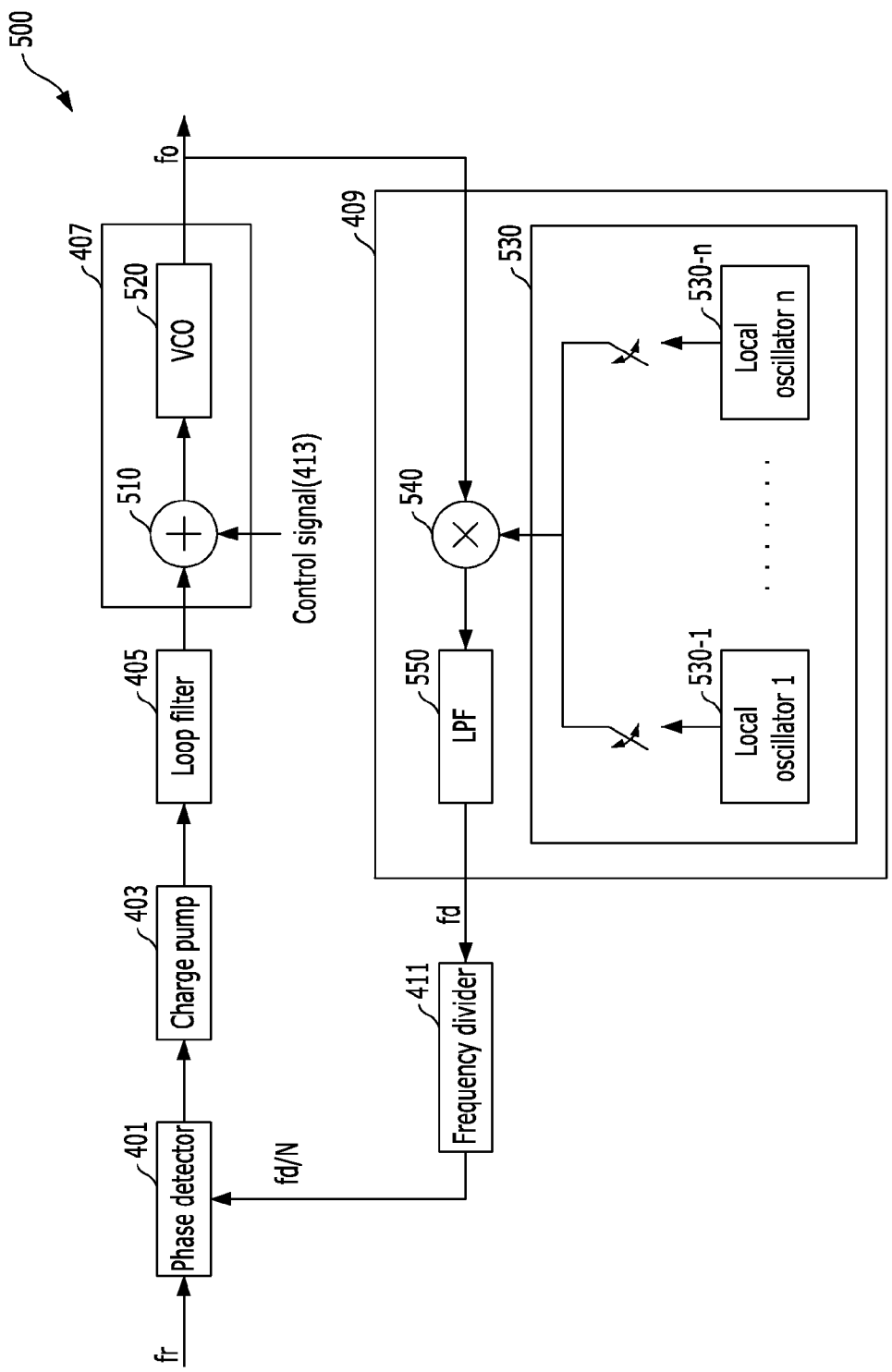
FIG. 5 is a block diagram illustrating a structure of a PLL in accordance with another embodiment of the present invention.

FIG. 5 is a block diagram illustrating a structure of a PLL in accordance with another embodiment of the present invention.

Referring to FIG. 5, the PLL 500 in accordance with another embodiment of the present invention includes a loop filter 405, a VCO unit 407, a frequency down-converting unit 409, and a frequency divider 411. Also, the PLL 500 may further include a phase detector 401 and a charge pump 403 like the typical PLL. Since components common to those of FIG. 4 have been described above, detailed description thereof will be omitted.

The VCO unit 407 includes an adder 510 and a VCO 250.

Figure 6:
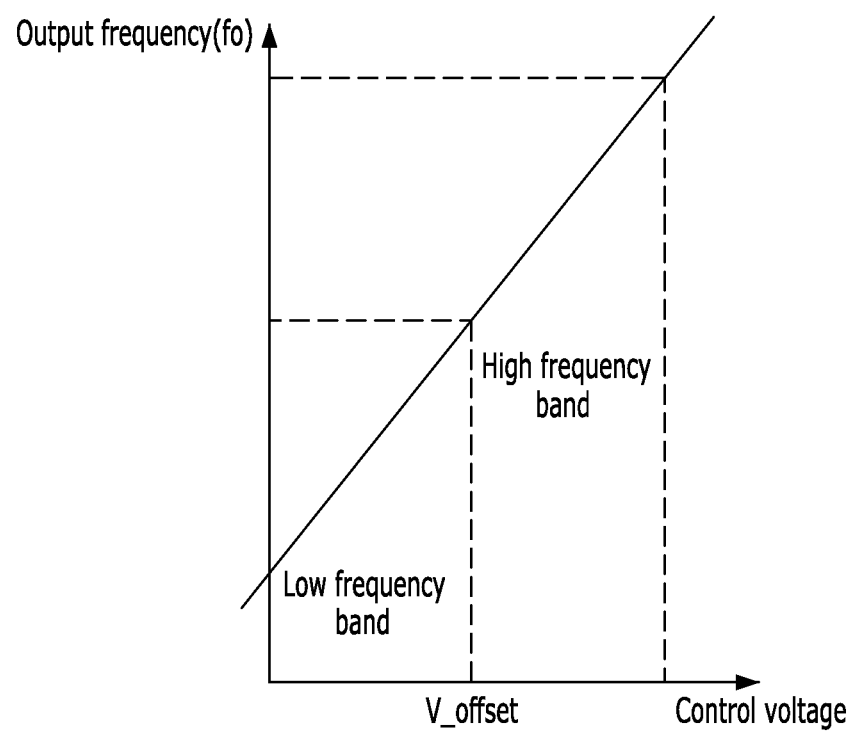
FIG. 6 is a graph showing the relationship between a control voltage and an output frequency of a VCO.

The adder 510 adds the output voltage of the loop filter 405 to the control signal 413 described in the foregoing embodiment. Referring to FIG. 6, the output frequency fo of the VCO 520 increases as the control voltage rises. Therefore, when the output frequency fo belongs to a high frequency band, an offset voltage V_offset is added so as to compensate the difference of frequencies used for down-conversion in the frequency down-converting unit 409. In this way, the VCO 530 can output a frequency of a high band. As one embodiment, the offset voltage V_offset may be obtained as a voltage corresponding to a frequency difference in a predetermined lookup table. Therefore, the control signal 413 of FIG. 5 may be an offset voltage V_offset.

The VCO 520 outputs the frequency fo which varies according to the output voltage of the adder 510.

The frequency down-converting unit 409 includes a variable frequency oscillator 530, a mixer 540, and a LPF 550.

The variable frequency oscillator 530 outputs a frequency which varies according to the band of the frequency fo outputted from the VCO 520. In the foregoing embodiment, when the output frequency fo belongs to the first band, the variable frequency oscillator 530 outputs 900 MHz. When the output frequency fo belongs to the second band, the variable frequency oscillator 530 outputs 1400 MHz.

At this time, the variable frequency oscillator 530 may use a single oscillator to output the frequency which varies according to the band of the output frequency fo, or may use a plurality of local oscillators which outputs preset frequencies according to the bands of the output frequency fo. When the band of the output frequency fo of the PLL 500 is divided by n (n>=2), the variable frequency oscillator 530 may include n local oscillators. The first to nth local oscillators 530-1 to 530-n output preset frequencies according to the bands of the frequency fo outputted from the VCO 520. The first local oscillator 530-1 outputs a frequency to be used to down-convert the output frequency fo belonging to the first band, and the nth local oscillator 530-n outputs a frequency to be used to down-convert the output frequency fo belonging to the nth band. In accordance with the foregoing embodiment, the first local oscillator 530-1 outputs 900 MHz when the output frequency fo of the VCO 520 belongs to the first band, and the second local oscillator outputs 1400 MHz when the output frequency fo of the VCO 520 belongs to the second band. The first to nth local oscillators 530-1 to 530-n may be PLLs.

In the case in which the variable frequency oscillator 530 uses a plurality of local oscillators, one of the local oscillators corresponding to the band of the frequency fo outputted from the VCO 520 is driven to output a corresponding frequency.

The mixer 540 down-converts the output frequency fo by using the output frequency of the variable frequency oscillator 530.

The LPF 550 low-pass-filters the output frequency of the mixer 540 in order to remove noise containing unnecessary high frequency components.

Figure 7:
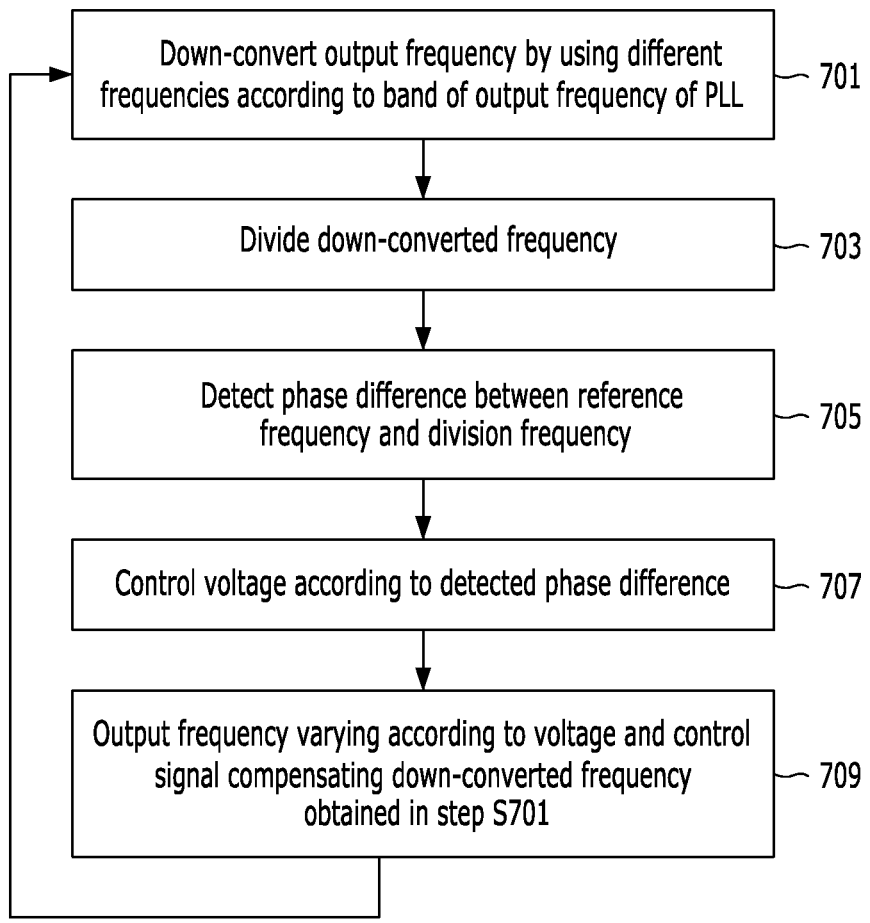
FIG. 7 is a flowchart illustrating a method for driving a PLL in accordance with an embodiment of the present invention.

FIG. 7 is a flowchart illustrating a method for driving a PLL in accordance with an embodiment of the present invention.

Referring to FIG. 7, the PLL down-converts an output frequency fo by using different frequencies according to the band of the output frequency fo at step S701. The band of the output frequency fo of the PLL may be divided by n (n>=2), and the output frequency fo is down-converted using a different frequency at each band. As described above, as the band of the output frequency fo is higher, the output frequency fo is down-converted using a higher frequency.

Figure 8A:
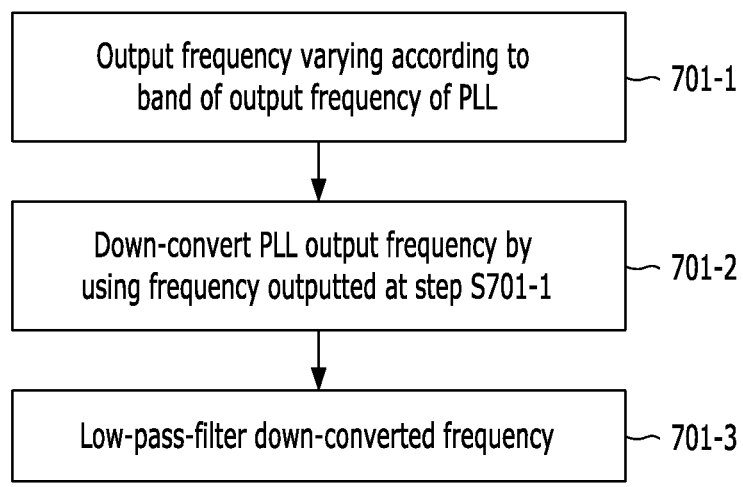
FIG. 8 is a flowchart illustrating a method for driving a PLL in accordance with another embodiment of the present invention.

Referring to FIG. 8A, the step S701 may be implemented with three sub-steps. A frequency varying according to the band of the output frequency fo of the PLL is outputted at step S701-1. The PLL may use a single oscillator to output the variable frequency, or may use a plurality of local oscillators to output preset frequencies according to the band of the output frequency fo. The plurality of local oscillators may be PLLs.

At step S701-2, the PLL down-converts the output frequency fo by using the frequency outputted at the step S701-1. For example, the output frequency fo may be down-converted using a mixer.

At step S701-3, the PLL low-pass-filters the frequency fd down-converted at the step S701-2. The low-pass-filtering may be performed using a LPF.

The PLL divides the frequency fd down-converted at the step S701-2 by a frequency division ratio N at step S703, and detects a phase difference by comparing the division frequency fd/N with a reference frequency fr at step S705. The reference frequency fr may be generated using a TCXO which is stable with respect to temperature change.

At step S707, the PLL controls a voltage according to the detected phase difference. At step S709, the PLL outputs the output frequency fo varying according to the voltage controlled at the step S707 and a signal compensating the frequency fd down-converted at the step S701. The output frequency fo outputted at the step S709 is inputted to the step S701 as illustrated in FIG. 7.

Figure 8B:
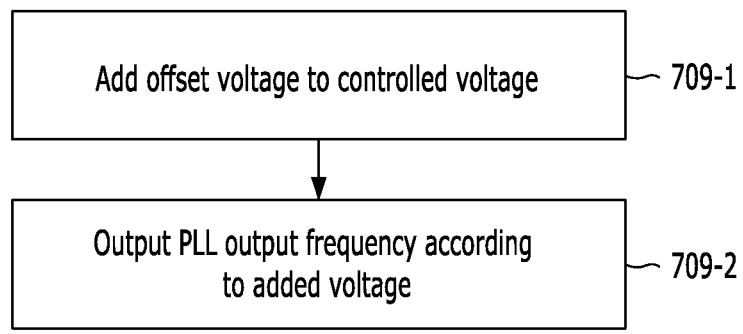

Referring to FIG. 8B, the step S709 may be implemented with two sub-steps. At step S709-1, the PLL adds the voltage controlled at the step S707 to an offset voltage compensating the difference of the frequencies used for down-conversion at the step S701. At step S709-2, the output frequency fo of the PLL is outputted according to the added voltage.

FIG. 9 is a bock diagram schematically illustrating the use of the PLL in a satellite communication terminal in accordance with an embodiment of the present invention.

Generally, radio communication refers to communication of information such as signals, codes, videos, and audios through radio waves. A satellite communication refers to a radio communication which relays a communication through an artificial satellite launched out of the atmosphere.

Figure 9A:
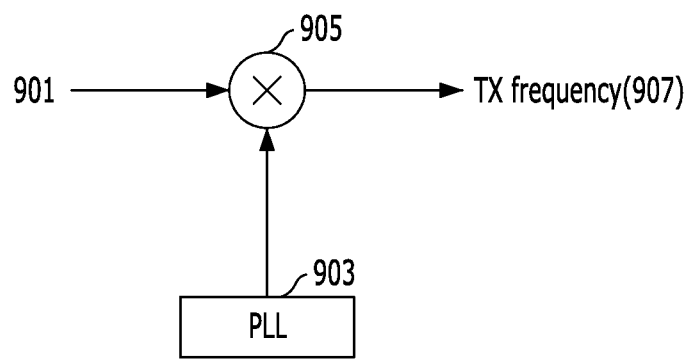
FIG. 9 is a bock diagram schematically illustrating the use of the PLL in a satellite communication terminal in accordance with an embodiment of the present invention.

Referring to FIG. 9A, a satellite communication terminal intends to transmit a signal at an arbitrary frequency 907 allocated from a central station within a broad frequency band. The PLL 903 generates a broadband local oscillation signal according to the frequency 907 to be transmitted by the satellite communication terminal. A mixer 905 receive a signal 901 to be transmitted, and converts the received signal 901 into the desired frequency 907 by using an output frequency of a PLL 903.

Figure 9B:
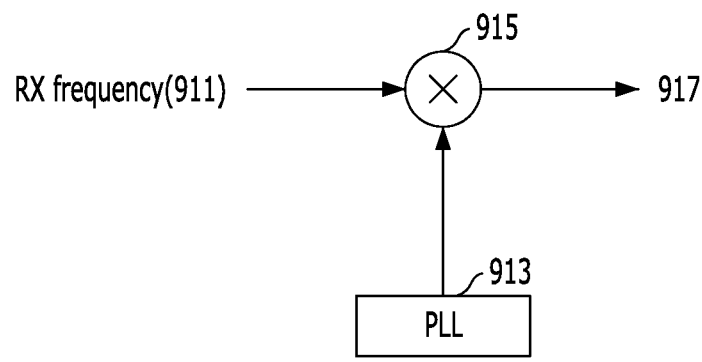

Also, the case in which the satellite communication terminal receives a broadband signal is equally applied. Referring to FIG. 9B, the PLL 913 generates a broadband local oscillation signal according to a frequency 911 received by the satellite communication terminal. A mixer 915 converts the received frequency 911 into a desired frequency 917 by using an output frequency of a PLL 913.

Phase noise when the PLL broadband signal is oscillated using the PLL or the driving method in accordance with the embodiments of the present invention will be described below. As described above, the case in which the output frequency fo of the PLL is 1-2 GHz and the band of the output frequency fo is divided into a first band (equal to or greater than 1 GHz and less than 1.5 GHz) and a second band (equal to or greater than 1.5 GHz and equal to or less than 2 GHz) will be described.

In this case, the frequency Fcomp of the phase detector 401 is 200 HKz and 1 Hz noise floor is −200 dBc/Hz. The first local oscillator outputs 900 MHz when the output frequency fo exists in the first band, and the second local oscillator outputs 1400 MHz when the output frequency fo exists in the second band.

The down-converted frequency fd and the frequency division ratio N are calculated using Equations 2 and 3 above, and the phase noise $N_M$ is calculated using Equation 1 above.

When the output frequency fo of the PLL is 1 GHz, the frequency division ratio N and the phase noise $N_M$ are as follows.

$N=fd(1\ GHz-900\ MHz=100\ MHz)/Fcomp(200\ KHz)$
$=500$ $N_M=-200+10\ \log(200000)+20\ \log(500)=-93.1\ dBc/Hz$ When the output frequency fo of the PLL is 1.5 GHz, the frequency division ratio N and the phase noise $N_M$ are as follows.

$N=fd(1.5\ GHz-1400\ MHz=100\ MHz)/Fcomp(200\ KHz)=500$ $N_M=-200+10\ \log(200000)+20\ \log(500)=-93.1\ dBc/Hz$ When the output frequency fo of the PLL is 2 GHz, the frequency division ratio N and the phase noise $N_M$ are as follows.

$N=fd(2\ GHz-1400\ MHz=600\ MHz)/Fcomp(200\ KHz)$
$=3000$ $N_M=-200+10\ \log(200000)+20\ \log(3000)=-77\ dBc/Hz$ As can be seen from Equations above, the frequency division ratio N was reduced as compared with the offset PLL 300. Accordingly, the phase noise was reduced. That is, the PLLs in accordance with the embodiments of the present invention can reduce the frequency division ratio N and thus reduce the phase noise even when it generates the broadband local oscillation signal. Furthermore, the case in which the band of the output frequency fo of the PLL is divided into three bands can obtain more excellent performance than the above result.

In accordance with the exemplary embodiments of the present invention, the phase noise of the PLL can be reduced. Moreover, the low phase noise characteristic can be obtained at both the low frequency band and the high frequency band even when the PLL generates the broadband local oscillation signal.

The PLLs in accordance with the exemplary embodiments of the present invention have the low phase noise characteristic and are used in generating the local oscillation signal.

The above-described methods can also be embodied as computer programs. Codes and code segments constituting the programs may be easily construed by computer programmers skilled in the art to which the invention pertains. Furthermore, the created programs may be stored in computer-readable recording media or data storage media and may be read out and executed by the computers. Examples of the computer-readable recording media include any computer-readable recoding media, e.g., intangible media such as carrier waves, as well as tangible media such as CD or DVD.

While the present invention has been described with respect to the specific embodiments, it will be apparent to those skilled in the art that various changes and modifications may be made without departing from the spirit and scope of the invention as defined in the following claims.

What is claimed is:

1. A phase locked loop comprising:
a loop filter;
a voltage controlled oscillating unit configured to output an output frequency thereof, the voltage controlled oscillating unit including
an adder adding an offset voltage to an output voltage of the loop filter, and
a voltage controlled oscillator outputting said output frequency of the voltage controlled oscillating unit, wherein said output frequency varies according to an output voltage of the adder;
a frequency down-converting unit configured to convert the output frequency of the voltage controlled oscillating unit to a down-converted frequency using a preset frequency determined by a band of the output frequency of the voltage controlled oscillating unit; and
a frequency divider configured to divide the down-converted frequency by a frequency division ratio,
wherein the offset voltage compensates a difference of frequency caused by the converting of the output frequency of the voltage controlled oscillating unit to the down-converted frequency in the frequency down-converting unit.

2. The phase locked loop of claim 1, wherein the frequency down-converting unit comprises:
a variable frequency oscillator configured to output the preset frequency determined by the band of the output frequency of the voltage oscillating unit;
a mixer configured to convert the output frequency of the voltage controlled oscillator to the down-converted frequency by using the preset frequency of the variable frequency oscillator; and
a low pass filter configured to low-pass-filter an output frequency of the mixer.

3. The phase locked loop of claim 2, wherein the variable frequency oscillator comprises a plurality of local oscillators, and
the preset frequency is outputted by one of the local oscillators corresponding to the band of the output frequency of the voltage controlled oscillating unit.

4. The phase locked loop of claim 3, wherein the local oscillators are implemented with phase locked loops.

5. A satellite communication terminal for transmitting a predetermined frequency, comprising:
a phase locked loop including
a loop filter,
a voltage controlled oscillating unit configured to output an output frequency thereof, the voltage controlled oscillating unit including
an adder adding an offset voltage to an output voltage of the loop filter, and
a voltage controlled oscillator outputting said output frequency of the voltage controlled oscillating unit, wherein said output frequency varies according to an output voltage of the adder, a frequency down-converting unit configured to convert the output frequency of the voltage controlled oscillating unit to a down-converted frequency using a preset frequency determined by a band of the output frequency of the voltage controlled oscillating unit and a frequency divider configured to divide the down-converted frequency by a frequency division ratio, wherein the offset voltage compensates a difference of frequency caused by the converting of the output frequency of the voltage controlled oscillating unit to the down-converted frequency in the frequency down-converting unit; and a first mixer configured to convert the predetermined frequency, which is to be transmitted, by using an output frequency of the phase locked loop.

6. The satellite communication terminal of claim 5, wherein the frequency down-converting unit comprises:

a variable frequency oscillator configured to output the preset frequency determined by the band of the output frequency of the voltage oscillating unit;

a second mixer configured to convert the output frequency of the voltage controlled oscillator to the down-converted frequency by using the preset frequency of the variable frequency oscillator; and a low pass filter configured to low-pass-filter an output frequency of the second mixer.

7. The satellite communication terminal of claim 6, wherein the variable frequency oscillator comprises a plurality of local oscillators, and the preset frequency is outputted by one of the local oscillators corresponding to the band of the output frequency of the voltage controlled oscillating unit.

8. The satellite communication terminal of claim 7, wherein the local oscillators are implemented with phase locked loops.

9. A satellite communication terminal for receiving a predetermined frequency, comprising:

a phase locked loop including
a loop filter,
a voltage controlled oscillating unit configured to output an output frequency, the voltage controlled oscillating unit including,
an adder adding an offset voltage to an output voltage of the loop filter, and
a voltage controlled oscillator outputting said output frequency of the voltage controlled oscillating unit, wherein said output frequency varies according to an output voltage of the adder, a frequency down-converting unit configured to convert the output frequency of the voltage controlled oscillating unit to a down-converted frequency using a preset frequency determined by band of the output frequency of the voltage controlled oscillating unit, and a frequency divider configured to divide the down-converted frequency by a frequency division ratio, wherein the offset voltage compensates a difference of frequency caused by the converting of the output frequency of the voltage controlled oscillating unit to the down-converted frequency in the frequency down-converting unit; and a first mixer configured to convert the received frequency by using an output frequency of the phase locked loop.

10. The satellite communication terminal of claim 9, wherein the frequency down-converting unit comprises:

a variable frequency oscillator configured to output the preset frequency determined by the band of the output frequency of the voltage oscillating unit;

a second mixer configured to convert the output frequency of the voltage controlled oscillator to the down-converted frequency by using the preset frequency of the variable frequency oscillator; and a low pass filter configured to low-pass-filter an output frequency of the second mixer.

11. The satellite communication terminal of claim 10, wherein the variable frequency oscillator comprises a plurality of local oscillators, and the preset frequency is outputted by one of the local oscillators corresponding to the band of the output frequency of the voltage controlled oscillating unit.

12. The satellite communication terminal of claim 11, wherein the local oscillators are implemented with phase locked loops.

* * * * *